(12) United States Patent
Chandra et al.

(10) Patent No.: US 6,284,312 B1
(45) Date of Patent: Sep. 4, 2001

(54) METHOD AND APPARATUS FOR CHEMICAL VAPOR DEPOSITION OF POLYSILICON

(75) Inventors: Mohan Chandra, Merrimack; Ijaz Hussain Jafri, Nashua; Kedar Prasad Gupta, Hollis, all of NH (US); Vishwanath Prasad, East Setauket, NY (US); Jonathan A. Talbott, Amherst, NH (US)

(73) Assignee: GT Equipment Technologies INC, Nashua, NH (US)

( * ) Notice: Subject to any disclaimer, the term of this patent is extended or adjusted under 35 U.S.C. 154(b) by 0 days.

(21) Appl. No.: 09/507,711

(22) Filed: Feb. 18, 2000

Related U.S. Application Data
(60) Provisional application No. 60/120,990, filed on Feb. 19, 1999.

(51) Int. Cl.[7] .................. B05D 7/22; C23C 16/24
(52) U.S. Cl. .............. 427/237; 427/255.18; 427/255.27; 427/255.393; 427/314; 423/349
(58) Field of Search ................ 427/237, 255.27, 427/255.28, 255.393, 255.18, 255.17, 314; 423/348, 349, 350

(56) References Cited

U.S. PATENT DOCUMENTS

| | | |
|---|---|---|
| 3,042,492 | 7/1962 | Thomsen . |
| 3,042,494 | 7/1962 | Gutsche . |
| 3,146,123 | 8/1964 | Bischoff . |
| 3,200,009 | 8/1965 | Reuschel et al. . |
| 4,123,989 | * 11/1978 | Jewett ................................. 118/49.5 |
| 4,265,859 | 5/1981 | Jewett . |
| 4,653,428 | * 3/1987 | Wilson et al. ......................... 118/725 |
| 4,657,616 | * 4/1987 | Benzing et al. ...................... 156/345 |
| 4,681,652 | * 7/1987 | Rogers et al. ........................ 156/613 |
| 4,981,102 | 1/1991 | Gautreaux et al. . |

\* cited by examiner

Primary Examiner—Shrive P. Beck
Assistant Examiner—Michael Barr
(74) Attorney, Agent, or Firm—Vernon C. Maine; Scott J. Asmus

(57) ABSTRACT

A method and apparatus, and product by process, for the production of bulk polysilicon by broad area chemical vapor deposition, consisting of a quartz envelope and base plate forming a reactor enclosure, with external radiant heaters providing the heat source. A thin wall, edge-defined film fed growth (EFG) silicon tube section is used as the deposition casing and reaction chamber wall. The tube is capped at the top and sealed to the base plate to form the reaction chamber. External heaters radiate heat through the quartz enclosure to heat the tube wall to deposition temperature. A through flow of process gas is introduced to initiate the deposition. A uniform wide surface area deposit occurs on the inside surface of the tube, causing the diameter to become increasingly smaller as the yield accumulates. In a two tube reactor, a smaller core tube is uniformly spaced and supported inside the outer tube for full flow of process gas around the core tube so that deposition occurs on both the outside and inside surface of the core tube. The outer tube may be configured for preheating by a flow of electrical current from the base plate to the cover plate.

19 Claims, 5 Drawing Sheets

METHOD AND APPARATUS FOR CHEMICAL VAPOR DEPOSITION OF POLYSILICON

CROSS REFERENCE TO RELATED APPLICATIONS

This application relates to and claims priority to pending U.S. application Ser. No. 60/120,990 filed Feb. 19, 1999.

Acknowledgements are due to The National Science Foundation (Division of Design, Manufacturing and Industrial Innovation) Small Business Innovation Research Program Grant Number DM1-9901717.

BACKGROUND OF THE INVENTION

1. Technical Field of the Invention

This invention relates to chemical vapor deposition of polysilicon directly onto the walls of a reaction chamber. More particularly, it relates to broad surface area chemical vapor deposition where a thin wall casing is used to construct the reaction chamber, and becomes the broad surface area form upon which the polysilicon deposit is made.

2. Background Art

One of the widely practiced conventional methods of polysilicon production is by depositing polysilicon in a chemical vapor deposition (CVD) reactor, and is referred to as Siemens method. In this method, polysilicon is deposited in a CVD reactor on high-purity thin silicon rods called "slim rods". Because of the high purity silicon from which these slim rods are fabricated, the corresponding electrical resistance of the slim rods is extremely high. Thus it is extremely difficult to heat this silicon "filament" using electric current, during the startup phase of the process.

Sometimes the slim rods are replaced by metallic rods that are more conductive and easier to heat with electrical current. This method is referred to as Rogers Heitz method. However, the introduction of metal into the chemical vapor deposition process introduces metal contamination. This contamination of the polysilicon yield is not acceptable in the semiconductor/microelectronics industry.

In the Siemens method, external heaters are used to raise the temperature of these high purity rods to approximately 400° C. (centigrade) in order to reduce their electrical resisitivity. Sometimes external heating is applied in form of halogen heating or plasma discharge heating. However in a typical method, to accelerate the heating process, a very high voltage, in the order of thousands of volts, is applied to the rods. Under the very high voltage, a small current starts to flow in the slim rods. This initial flowing current generates heat in the slim rods, reducing the electrical resistance of the rods and permitting yet higher current flow and more heat.

This process of sending low current at high voltage continues until the temperature of slim rods reaches about 800° C. At this temperature, the resistance of the high purity silicon rods falls very drastically and the high voltage source is switched to a low voltage source that is capable of supplying high current.

Referring to prior art FIG. 1, a CVD reactor consists of a base plate 23, quartz bell jar 17, chamber cover 24, bell jar supports 16, and heater 18 between the bell jar and the chamber cover. There is incorporated in base plate 23, a gas inlet 20 and a gas outlet 21, and electrical feedthroughs 19. A viewing port 22 provides for visual inspection of the interior.

In the prior art polysilicon manufacturing process by CVD, the silicon slim rod structure is assembled in the form of a hair pin by having a cross rod 2 placed horizontally on two long, spaced apart, vertical rods 1 and 3. The structure is mounted and connected so as to provide a current path between electrical feedthroughs 19. During the CVD process, polysilicon deposit accumulates uniformly on the slim rods; the deposit being shown here partially removed to show the slim rod structure.

Different users employ different methods for joining the horizontal rod to the vertical rods. One method requires a groove or a key slot at the top of each vertical rod. A small counter bore or conforming figment is formed on the ends of the horizontal rod so that it can be press fitted into the grooves to bridge the two vertical rods.

A typical prior art reactor consists of a complex array of subsystems. Two power sources are required, one power supply that can provide very high voltages and low current; and a second power supply that can sustain a very high current at relatively lower voltage. Also needed are the slim rod heaters and their corresponding power supply for pre-heating the slim rods. Another component is the high voltage switch gear. Moreover, the entire startup process is cumbersome and time consuming. Since the current drawn by the slim rods at around 800° C. is of a run away nature, the switching of the high voltage to low voltage needs to be done with extreme care and caution.

Also, through this electric current method for heating the slim rods, the rods become an interior heat source losing tremendous amounts of heat via radiation to the surroundings. There is significant energy loss inherent in the existing practice.

SUMMARY OF THE INVENTION

It is an object of the invention to provide an apparatus and method for more efficient production of polysilicon by chemical vapor deposition, using less power and resulting in lower cost, by using a thin wall tubular casing to construct a reaction chamber, heating the casing from outside the chamber, and depositing polysilicon directly upon the interior wall of the casing.

It is a further object of the invention to provide a method to eliminate many of the costly components of the prior art CVD process reactor by replacing the basic slim rod design of the prior art as the core element and target for deposition, with a thin wall tubular section or casing as the target for broad area deposition.

The availability of large diameter silicon tubes, readily drawn using the EFG (edge-defined film fed growth) method, motivated the research leading to the present invention. Other means for extruding or forming tubular casings or structures suitable for deposition in the manner of the invention as the walls of a reaction chamber or as broad surface area deposition targets within the reaction chamber, are within the scope of the invention.

In accordance with the invention, a chemical vapor deposition reactor is specifically designed to utilize a reaction chamber constructed from a section of tubular material, which may be of silicon, graphite or suitable metals. The chamber is closed at bottom and top ends as may be done with a base plate and cover respectively. The inner surface of the tube becomes the wall of the reaction chamber. When radiant heat is applied from sources external to the chamber, as with jacket heaters applying radiant heat through a quartz envelope, sufficient to heat the chamber walls to the necessary deposition temperature, and a suitable carrier gas and reactant materials containing silicon are admitted into the chamber, the hot chamber walls become a broad surface area available for deposition.

As the chemical vapor deposition proceeds, a continuous, broad surface layer of polysilicon is deposited on the chamber wall, building in thickness so that the interior diameter of the chamber grows progressively smaller. This results in the production of a hollow, tubular bulk quantity of polysilicon with a thin wall tubular casing. The casing can be included or removed prior to further processing of the polysilicon.

A further refinement of the invention provides for the placement of a somewhat smaller diameter thin wall core tube suspended in the center of the reaction chamber formed by the larger diameter shell tube, so that broad area deposition occurs on both the inner and outer surfaces of the core tube concurrently with deposition on the inner surface of the shell tube. This results in a larger yield over the same reaction time, and more efficient use of the reactor.

The most common carrier gas for chemical vapor deposition of polysilicon is hydrogen, although an inert gas could be used. Suitable reactant materials for use with a hydrogen carrier are either silane, SiH4, having a deposition temperature in the order of 800 degrees centigrade, or any of the chlorosilanes, which have a deposition temperature in the order of 1000 to 1200 degrees, depending on the actual composition and process details. The primary product of the process is, of course, a solid deposit of polysilicon on the interior walls of the reaction chamber. The gaseous byproducts of the process are removed continuously through outlet ports, as new carrier gas and reactant materials are admitted into the chamber.

Still other objectives and advantages of the present invention will become readily apparent to those skilled in this art from the detailed description, wherein we have shown and described a preferred embodiment of the invention, simply by way of illustration of the best mode contemplated by us on carrying out our invention.

DESCRIPTION OF THE PREFERRED EMBODIMENT

The invention is susceptible of many variations. Accordingly, the drawings and following description of the preferred embodiment are to be regarded as illustrative in nature, and not as restrictive.

Figure 2:
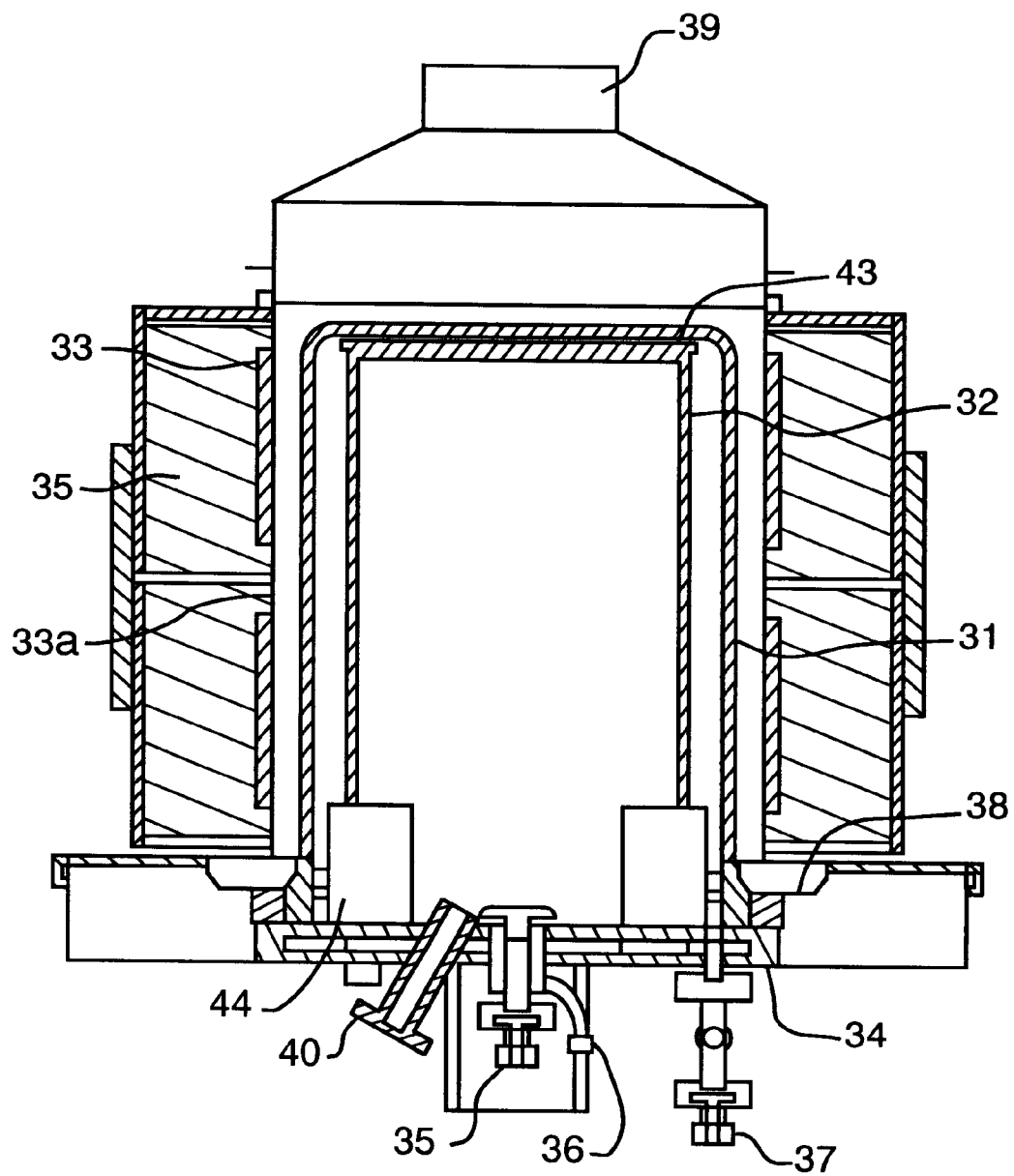
FIG. 2 is a side elevation cross section of a CVD reactor configured with a single silicon tube deposition target for accumulating an interior surface deposit of polysilicon.

The invention employs a novel approach to the application of the Chemical Vapor Deposition (CVD) reactor process for polysilicon production. Referring to FIG. 2, a preferred embodiment of the invention utilizes an external jacket heater assembly 33, with quartz heater cover 33A on the inside face, and outside insulation layer 35. The heater assembly, which can be made from, for example, any refractory metal, is arranged symmetrically around a quartz envelope 31 of the reactor apparatus. The heater assembly will have no contact with the reacting gases. The choice for the design, materials and construction of the heater assembly is dependent on the requirements of providing sufficient inwardly radiated heat to the reactor to maintain adequate temperature on the deposition surface area of a silicon tube within the reactor so that polysilicon deposition can occur, with minimum energy loses due to heat radiated outwardly from the heater assembly.

Within quartz envelope 31 there is a vertically arranged, hollow, EFG drawn silicon tube 32, in this embodiment being 30 centimeters diameter and about one meter tall, which is closed at the top end by a thin graphite cover 43 to form a primary CVD reaction chamber. Although this preferred embodiment utilizes a uniformly circular silicon tube 32, the use of any other tubular shape such as non-uniformly circular, square, rectangular, or octagonal, is within the scope of the invention. The bottom end of tube 32 rests on graphite support 44, and hense on base plate 34, forming the primary reaction chamber.

The system is purged to remove air; then radiant heat is applied by electric heater assembly 33 until tube 32 reaches deposition temperature. Radiant heat penetrates quartz envelope 31 to silicon tube 32. From the outside of silicon tube 32, heat is transferred via conduction through the thin wall of the tube to the inner surface of silicon tube 32. Heat conduction through the tube wall happens readily because the starting thickness of the EFG grown tube wall is of the order of 300 to 800 micrometers. The tubular structure can be fabricated by any means and be of material other than silicon, so long as it meets the structural and thermal requirements.

When the wall is at deposition temperature, a process gas mixture of carrier gas and reactant materials is piped into the reaction chamber through process gas inlet 35, while carrier gas is admitted through blanket gas inlet 37. The blanket gas is automatically maintained at slightly higher pressure in the blanket zone than within the primary reaction chamber so as to assure there is no outflow leakage of gaseous by-product from the reaction chamber. During the chemical vapor deposition reaction within tube 32, the gaseous byproducts are evacuated through process gas outlet 36.

A cooling gas, in the preferred embodiment being air, is admitted at cooling gas inlet 38 and exhausted at cooling gas outlet 39, during the process, in order to control external temperature of quartz envelope 31. Process viewing port 40 in base plate 34 provides for process monitoring within the reaction chamber.

As deposition starts and continues on the inside of tube 32, the inner diameter of the tube gets smaller and smaller. To compensate for the growing wall thickness, more power is applied to the heating assembly to generate more heat, to maintain the temperature on the inner surface of the silicon deposit at the required value to continue the process.

The apparatus can be constructed and configured so that electrical current can also be passed directly through the length of tube 32 itself, analogous to the slim rod heating of the prior art. The preferred current path for tube conductance is from an electrical connection at graphite support 44, through silicon tube 32 and graphite cover 43 through an electrical connection on cover 43. This mode of heating can be used as a supplement or alternate method of heating the deposit wall surface.

Figure 3:
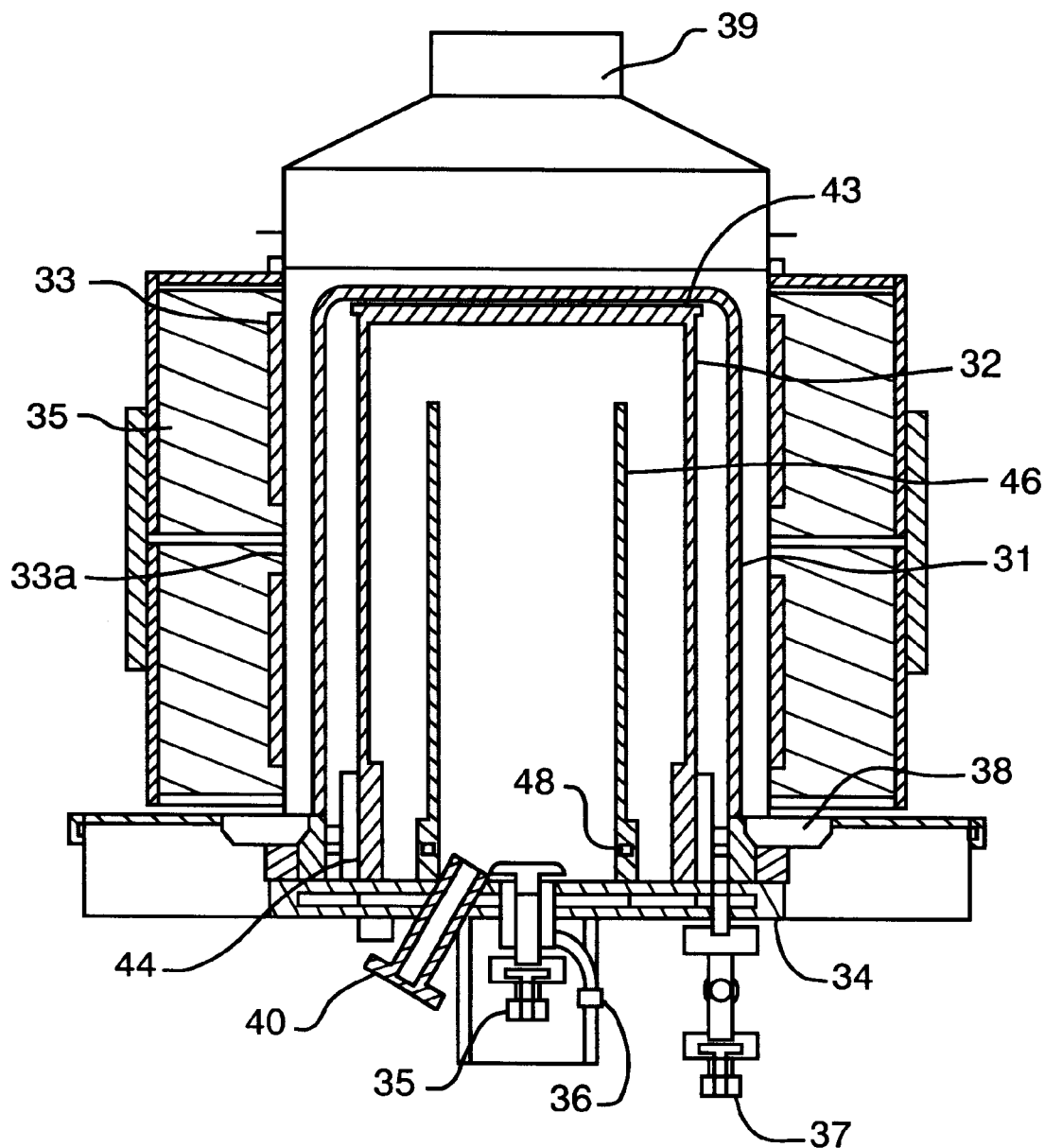
FIG. 3 is a side elevation cross section of the CVD reactor of FIG. 2 configured with two silicon tube deposition targets, a smaller diameter tube for accumulating polysilicon deposits on both interior and exterior surfaces, and a larger diameter tube which as in FIG. 2, for accumulating a polysilicon deposit only on its interior surface.

Referring to FIG. 3, another preferred embodiment of the invention likewise utilizes an external jacket heater assembly 33, with quartz heater cover 33A on the inside face, and outside insulation layer 35. The heater assembly, which can be made from, for example, any refractory metal, is arranged symmetrically around a quartz envelope 31 of the reactor apparatus. The heater assembly has no contact with the reacting gases. The choice for the design, materials and construction of the heater assembly is selected to provide sufficient radiant heat to the reactor to maintain adequate temperature on the inner wall surface of an EFG drawn silicon outer tube, and on the outer and inner wall surfaces of a smaller diameter EFG drawn silicon core tube centered and supported within the outer tube so as to allow the ready flow of reacting gases to pass over and under the ends of the core tube, so that polysilicon deposition can occur on all three wall surfaces.

Within quartz envelope 31 there is a vertically arranged, hollow silicon outer tube 32, in the preferred embodiment being 30 centimeters diameter and about one meter tall, which is closed at the top end by a thin graphite cover 43 to form a primary CVD reaction chamber. The cover can be of material other than graphite, including quartz or silicon. Centered within tube 32, there is a vertically arranged, hollow, EFG drawn silicon inner tube 46, in this embodiment being 15 centimeters diameter and about 100 centimeters tall. Although this preferred embodiment utilizes a uniformly circular silicon tube 32, the use of any other tubular shape such as non-uniformly circular, square, rectangular, or octagonal, is within the scope of the invention.

The bottom end of tube 32 rests on graphite support 44, and hence on base plate 34. The bottom end of inner tube 46 rests on open graphite supports 48 resting on base plate 34, configured to permit the free flow of reaction gases between the bottom end of the tube and base plate 34. The top end of tube 46 is sufficiently spaced below cover 43 to likewise permit the free flow of reaction gases between the top end of the tube and the cover.

As in the FIG. 2 embodiment, the system is purged to remove air; then radiant heat is applied by electric heater assembly 33 until tube 32 reaches deposition temperature. Radiant heat penetrates quartz envelope 31 to silicon tube 32. From the outside of silicon tube 32, heat is transferred via conduction through the thin wall of the tube to the inner surface of silicon tube 32, and by radiation to tube 46. Heat conduction through the tube wall happens readily because the starting thickness of the EFG grown tube wall is of the order of 300 to 800 micrometers. Tubes 32 and 46 can be fabricated of material other than silicon, so long as it meets the structural and thermal requirements.

When the innermost wall is at deposition temperature, a process gas mixture of carrier gas and reactant materials is piped into the reaction chamber through process gas inlet 35, while carrier gas is admitted through blanket gas inlet 37. The blanket gas is automatically maintained at slightly higher pressure in the blanket zone than within the primary reaction chamber so as to assure there is no outflow leakage of gaseous by-product from the reaction chamber. During the chemical vapor deposition reaction within tube 32, the gaseous byproducts are evacuated through process gas outlet 36.

Again as in the prior embodiment, a cooling gas, is admitted at cooling gas inlet 38 and exhausted at cooling gas outlet 39, during the process, in order to control external temperature of quartz envelope 31. Process viewing port 40 in base plate 34 provides for process monitoring within the reaction chamber.

As in the prior embodiment, as deposition layers grow thicker, more heat must be applied to the reaction chamber to maintain the temperature on the inner diameter core tube deposit surface at the required value, until the desired thickness has been achieved. Each user will need to analyse the chemical species, process time, energy requirements and costs, and yeild, in order to optimize its process cycle.

Again, the FIG. 3 method and apparatus can be constructed and configured so that electrical current can also be passed directly through the length of tube 32 itself, analogous to the slim rod heating of the prior art. The preferred current path for tube conductance is from an electrical connection at graphite support 44, through silicon tube 32 and graphite cover 43 through an electrical connection on cover 43. This mode of heating can be used as a supplement or alternate method of heating the deposit wall surface.

Figure 6:
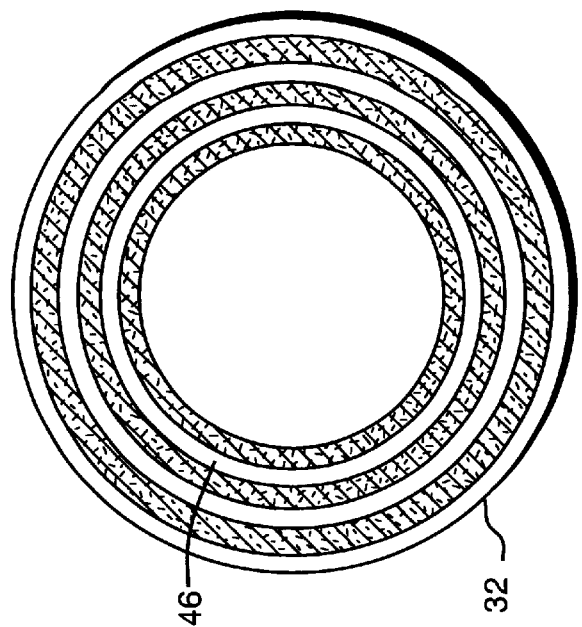
FIG. 6 is a cross section top view of the two tube reactor of FIG. 3, and its post-process accumulated deposits of polysilicon on three surfaces.
Figure 4:
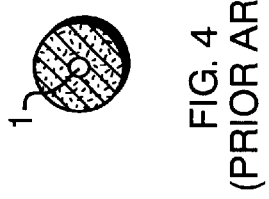
FIG. 4 is a cross section top view of a prior art slim rod and its post-process accumulated deposit of polysilicon.
Figure 5:
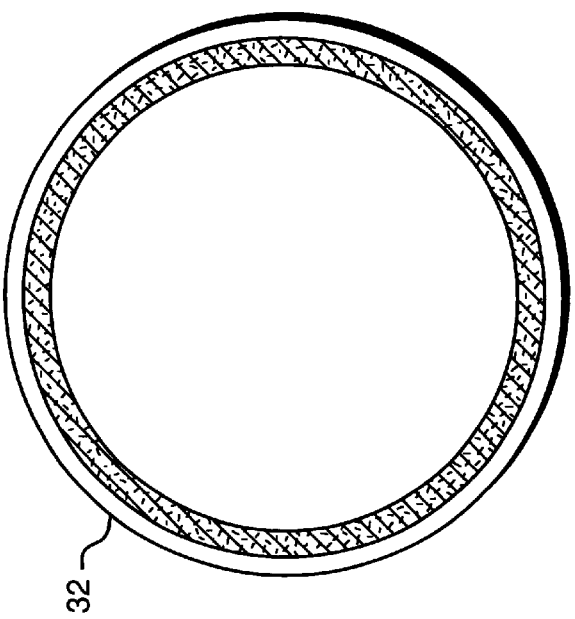
FIG. 5 is a cross section top view of the single tube reactor of FIG. 2, and its post-process accumulated deposit of polysilicon on the interior surface.

Referring to FIGS. 4, 5, and 6, there is shown in cross section the final deposition pattern of polysilicon on the FIG. 4, slim rod 1, of the prior art, and its comparison to the deposition pattern and relatively greater volume of the embodiments of the invention of FIG. 2, tube 32, and FIG. 3, tubes 32 and 46 respectively. It should be noted that in the prior art, multiple slim rods are attached in the hairpin configuration in a large CVD reactor. The reactor sizes are quite big to accommodate anywhere from 6 to 18 rod sets. To simplify the comparison here, a single slim rod is being compared with one meter long tube setups of the preferred embodiments.

Figure 1:
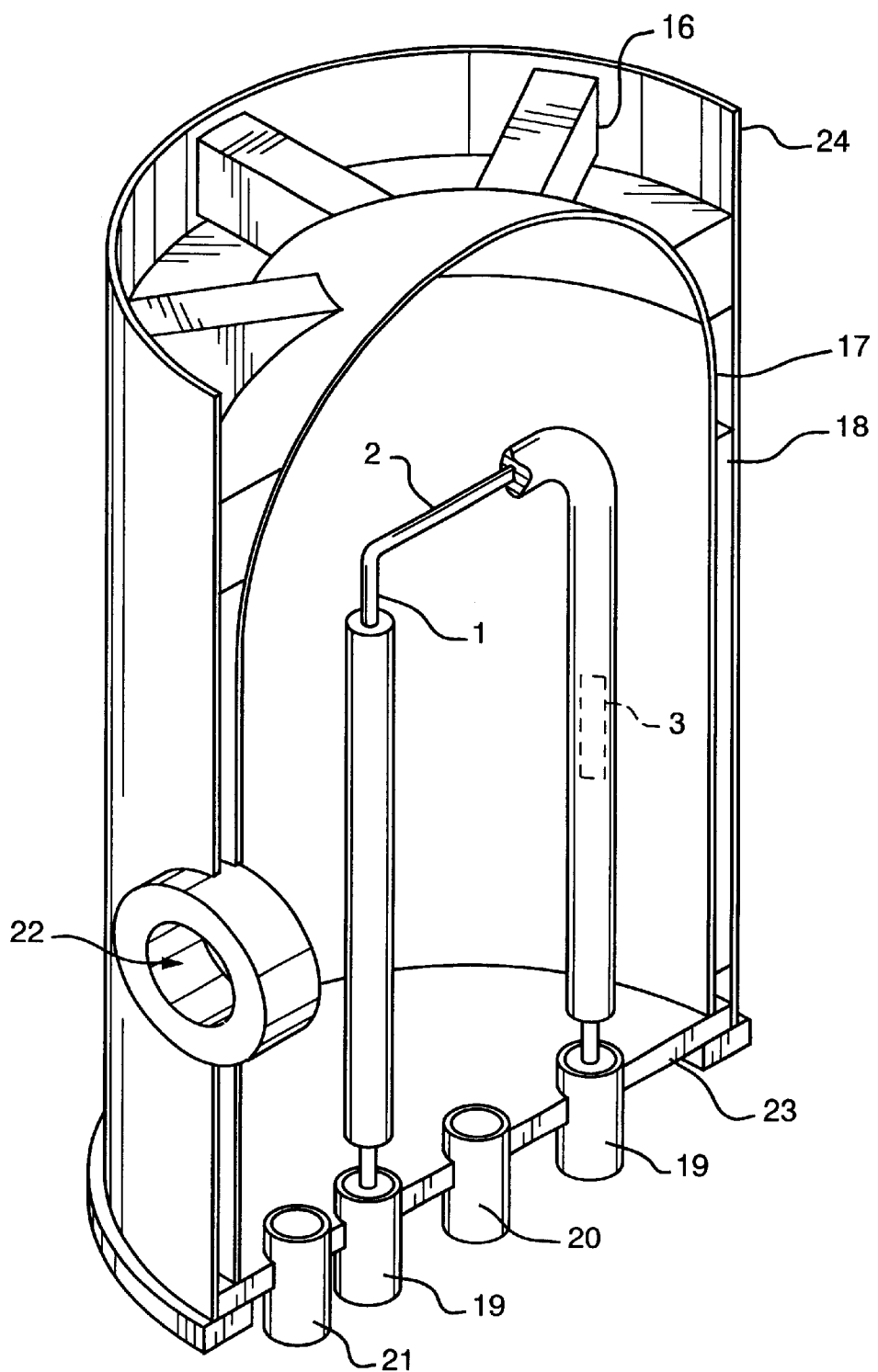
FIG. 1 is a cut-away, perspective view of a prior art CVD reactor for polysilicon deposition with a slim rod in the form of a hair pin.
Figure 7:
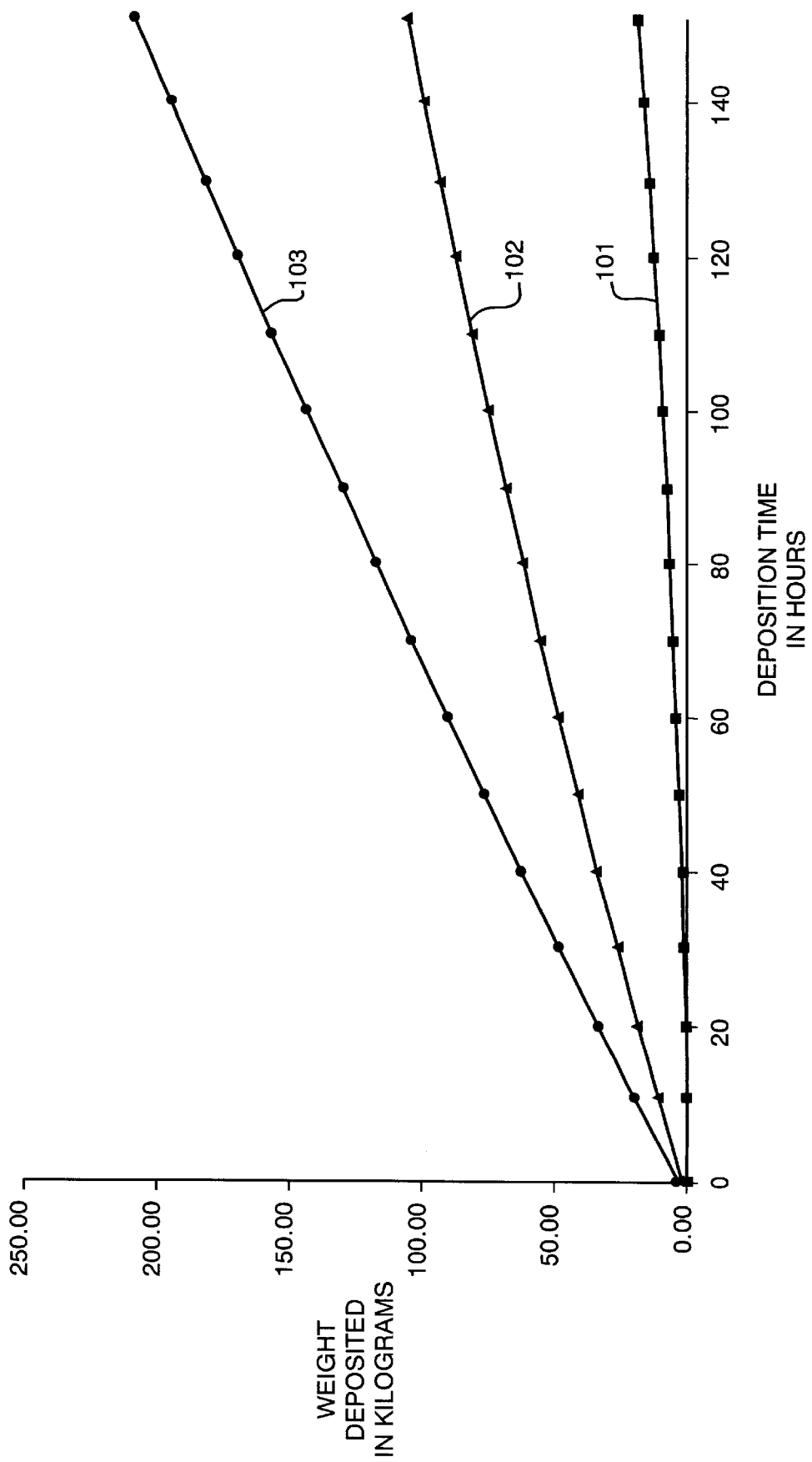
FIG. 7 is a graph depicting the relative weight of deposited polysilicon versus deposition time for the prior art slim rod setup of FIG. 1, the single tube reactor setup of FIG. 2, and the two tube reactor setup of FIG. 3.

Referring to FIG. 7, this three line graph of yield by weight deposited in kilograms of polysilicon versus deposition time in hours, correlates to the performance of the prior art FIG. 1 setup, squares legend line 101, and the embodiments of FIG. 2, triangles legend line 102, and FIG. 3 circles legend line 103. All operating parameters being the same, the deposition rate will be the same for all three cases. For this comparison, the rate of deposition is assumed to be 5 microns/minute. The starting diameter for the FIG. 1 slim rod is seven millimeters; for the FIG. 2 single tube, 300 millimeters; and for the FIG. 3 two tube setup, 300 millimeters and 150 millimeters respectively.

The comparative slope of each line illustrates the relatively greater yield potential of the FIGS. 2 and 3 embodiments of the invention compared to the prior art practice. For a deposition time of about 120 hours, a slim rod is likely to achive a diameter of about 8–10 cm, and a line 101 yield of 12 kgs. In comparison, the FIG. 2 preferred embodiment single tube weight, line 102, reaches 86 kgs. The FIG. 3 two tube embodiment weight, line 103, for the same deposition time reaches 167 kgs.

Depending on the end use of the polysilicon produced, the outer portion of the FIG. 2 polysilicon tube 32, and the FIG. 3 outer tube 32, after deposition can be ground off or etched off to remove the original tube wall material. This is possible because the starting thickness of the EFG grown tubes is of the order of 300 to 800 micrometers. Removal of the original wall material removes any possible contaminants that may have been present on the tube at the start of the deposition process.

In the case of core tube 46 with inner and outer deposit layers, the core tube is inaccessible for removal in this manner. However, since that the weight of the tube is extremely small compared to the end weight of deposited material, the total concentration of contaminants becomes extremely small once the polysilicon material is melted for production of silicon.

The method of the invention as described above, illustrated, and claimed below, has many advantages over the prior art. No preheating of the tube is required in order to reduce the electrical resistance of the core material. There is no requirement for the high voltage source and the high voltage switchgear. The deposition process starts very quickly because the hollow, thin wall, silicon tubes are brought up to operating temperature much faster then any other prior art method.

In the prior art, there is very little control on radiation losses within the reactor. This increases the energy required per kilogram of silicon yield, considerably. The method and apparatus of the invention suppresses the radiation loss considerably since there are no water-cooled jackets used to remove radiated heat. Since the heating is initiated from the outside of the reactor, there is little radiation loss to water-cooled walls since apart from the base plate, there are none. In the prior art, this heat loss can be as much as ninety percent (90%).

The walls of the quartz outer cover are kept cold by forced air cooling to prevent any silicon deposition on the walls. In prior art the slimrods become a heat source loosing heat to the surroundings, whereas in the new method, energy is supplied to the tube surface to keep it a certain temperature thereby reducing the energy losses.

In prior art, because of the need to produce a high yield on a per batch basis, multiple slim rod structures are needed in each batch. This makes the reactors very expensive. There is always a possibility of slim rods touching and fusing together because of the high currents that are required for to maintain the temperature. With the present invention, this phenomenon does not occur because there is no special need to pass current through the silicon tube itself.

Yet another obvious advantage is that the weight of silicon deposited will be very large compared to the practices of the prior art due to the large surface area available for deposition.

As will be realized, the invention is capable of other and different embodiments and its several details are capable of modifications in various obvious respects, all without departing from the essence of the invention.

To those skilled in the art, the invention admits of many variations. For example, one variation consists of using a chemical vapor deposition reactor that is basically a quartz envelope attached to a base plate so as to form an enclosure, with means for applying heat to the enclosure, and gas inlet and outlet ports in the base plate that provide for passing a flow of carrier gas ladened with silicon reactant materials into the enclosure, and the gaseous byproducts of the CVD process out of the enclosure.

There is a circular graphite tube support system on the base plate for supporting a vertically arranged deposition shell or outer tube. The tube support system encloses the gas inlet and outlet ports. There is a corresponding cover plate for capping the shell tube against the base plate so as to form a closed reaction chamber. The cover plate may be made of graphite, or of other materials, and may be configured and heated so as to accept deposition or cooled to avoid deposition.

The length or surface area of the walls of the tubular casing may be heated or cooled selectively in order to control the areas and/or relative thickness of the deposit.

The tubular structure and its end caps may be arranged in the reactor with other than a vertical orientation, so long as there is adequate mechanical support, access ports for conducting the process are provided, and radiant heat can be applied so as to heat the desired deposition surfaces.

The method used in conjunction with the apparatus above is to install within the reactor on the tube support system a thin wall EFG silicon tube, and then cap the upper end of the tube with the graphite cover plate so as to form within the enclosure a closed reaction chamber bounded by the base plate, the tube support system, the interior surface of the tube, and the cover plate. As noted above, a vertical orientation is preferable but configurations other than vertical are within the scope of the invention.

Then radiant heat is applied from outside the enclosure, through the quartz wall, for raising to and maintaining the interior surface of the thin wall tube at a suitable deposition temperature for the select combination of carrier gas and silicon reactant materials being used. With the reaction chamber defined in this manner and the tube heated to the required temperature, the flow of process gas, typically hydrogen ladened with silane or chlorosilane, is introduced and continuously flowed into the chamber through the gas inlet port, starting and feeding the continuous CVD process, while the gaseous byproducts pass out through the gas outlet port.

Another embodiment adds a blanket gas port in the base plate communicating with the enclosure, but arranged to be outside the circular graphite tube support system so that it will be outside the reaction chamber. This space functions as a blanket zone around the reaction chamber. Carrier gas or an inert gas is piped into the blanket zone through the blanket gas port and held there at slightly elevated pressure as compared to the reaction chamber pressure, the slight positive differential pressure thus assuring no leakage of process or by-product gases out of the reaction chamber.

Yet another embodiment introduces means for flowing cooling air between the external heater assembly and the quartz envelope, to maintain the quartz envelope at well below deposition temperature, such as a vertical, fan-forced air flow exhausting from a top side vent.

Still yet another embodiment of the invention introduces a core tube support system on the base plate, where the core tube support system is of smaller diameter and centered within the shell tube or outer tube support system. A thin wall, EFG silicon tube of smaller diameter than the shell or outer tube is vertically emplaced on the support system. The top of the core tube is well spaced below the graphite cover for through flow of gas over the top edge of the core tube, and the core tube support system consists of individual uniformally spaced apart supports or is otherwise of open framework or ventilated to allow through flow of gas beneath the bottom edge of the core tube, so that process gases flow readily in and out of the core tube and throughout the entire reaction chamber. Of course, sufficient heat must be directed into the quartz enclosure to raise and maintain both the shell or outer tube, and the inner or core tube, at suitable deposition temperature while the deposited layers grow in thickness.

An additional embodiment of the invention is the product itself, being a novel form of bulk CVD polysilicon producible only by the method of the invention; specifically a bulk polysilicon structure consisting of a uniform layer of polysilicon deposited by chemical vapor deposition on the surface of a thin wall tube.

As will be realized, the invention is capable of other and different embodiments, and its several details are capable of modifications in various obvious respects, all without departing from the invention.

We claim:

1. A method for production of bulk polysilicon by chemical vapor deposition comprising the steps of:

using a quartz envelope on a base plate with an inlet port and an outlet port, each said port communicating with the interior of said envelope, vertically emplacing within said envelope on said base plate an enclosed tubular silicon casing positioned so as to be communicating with said inlet port and said outlet port, raising to and maintaining the interior surface of said casing at the deposition temperature of a select combination of carrier gas and silicon reactant material using a heat source comprising at least a radiant heat source external of said quartz envelope, flowing said carrier gas ladened with said silicon reactant material through said inlet port into said enclosure, conducting within said tubular casing a CVD process utilizing said combination of carrier gas and silicon reactant material such that a bulk polysilicon layer is deposited upon the interior wall of said tubular casing, flowing gaseous byproducts of said CVD process out of said enclosure through said outlet port, removing as a bulk polysilicon product from said quartz envelope said tubular casing with said bulk polysilicon layer.

2. A method for production of bulk polysilicon by chemical vapor deposition comprising the steps of:

using a cold wall chemical vapor deposition reactor comprising a quartz envelope attachable to a base plate so as to form a closed quartz enclosure, a process gas inlet and a process gas outlet in said base plate communicating with said enclosure, and outer tube support system on said base plate within said closed quartz enclosure enclosing said gas inlet port and said gas outlet port, and a cover plate, vertically emplacing within said enclosure on said tube support system an outer tube, capping the upper end of said outer tube with said cover plate so as to form within said enclosure a closed reaction chamber bounded by said base plate and said tube support system and the interior surface of said outer tube and said cover plate, applying radiant heat to said closed quartz enclosure sufficient for raising to and maintaining the interior surface of said outer tube at the deposition temperature of a select combination of carrier gas and silicon reactant material, flowing said carrier gas ladened with said silicon reactant material through said process gas inlet port into said primary reaction chamber, conducting within said closed reaction chamber a CVD process utilizing said combination of carrier gas and silicon reactant material such that a bulk polysilicon layer is deposited upon the interior surface of said outer tube and said cover plate, flowing gaseous byproducts of said CVD process out through said process gas outlet port, and removing as a bulk polysilicon product from said quartz envelope said outer tube with said bulk polysilicon layer.

3. A method for producing polysilicon according to claim 2, said reactor further comprising a blanket zone between said quartz envelope and said reaction chamber, and a blanket gas port in said base plate communicating with said blanket zone, said method further comprising the steps of:

admitting a blanket gas through said blanket gas port into said blanket gas zone, maintaining positive pressure in said blanket gas zone with respect to said primary reaction chamber during said CVD process.

4. A method for producing polysilicon according to claim 3, said carrier gas and said blanket gas being hydrogen.

5. A method for producing polysilicon according to claim 3, said carrier gas and said blanket gas being the same gas.

6. A method for producing polysilicon according to claim 2, said carrier gas being hydrogen, said silicon reactant material being silane.

7. A method for producing polysilicon according to claim 2, said carrier gas being hydrogen, said silicon reactant material being a chlorosilane.

8. A method for producing polysilicon according to claim 2, said carrier gas being an inert gas.

9. A method for producing polysilicon according to claim 2, said means for applying heat comprising using an external radiant heater assembly surrounding said quartz envelope.

10. A method for production of bulk polysilicon according to claim 2, said reactor further comprising a core tube support system on said base plate, said core tube support system being of smaller diameter and centered within said outer tube support system and ventilated for through flow of gas, said method comprising the further steps:

vertically emplacing within said reactor on said core tube support system a silicon core tube, said core tube being of smaller diameter than said outer tube and open at both ends, applying sufficient heat to said silicon core tube so as to raise to and maintain the surfaces of said core tube at the deposition temperature of said select combination of carrier gas and silicon reactant material during said CVD process, removing as a bulk polysilicon product from said quartz envelope said core tube with a said bulk polysilicon layer deposited on both inner and outer surfaces thereof.

11. A method for production of bulk polysilicon by chemical vapor deposition comprising the steps of:

using a quartz envelope on a base plate with an inlet port and and outlet port, each said port communication with the interior of said envelope, vertically emplacing within said envelope on said base plate an open ended core tube, vertically emplacing within said envelope on said base plate an enclosed tubular silicon casing positioned so as to encompass and not contact said core tube and to be communicating with said inlet port and said outlet port, raising to and maintaining the interior surface of said casing and said core tube at the deposition temperature of a select combination of carrier gas and silicon reactant material using a heat source comprising a radiant heat source external of said quartz envelope, flowing said carrier gas ladened with said silicon reactant material through said inlet port into said enclosure, conducting within said tubular casing a CVD process utilizing said combination of carrier gas and silicon reactant material such that a bulk polysilicon layer is deposited upon the interior wall of said tubular casing and upon the interior and exterior walls of said core tube, flowing gaseous byproducts of said CVD process out of said enclosure through said outlet port, removing as a bulk polysilicon product from said quartz envelope said core tube and tubular casing with said bulk polysilicon layers.

12. A method for production of bulk polysilicon by chemical vapor deposition comprising the steps of:

using a cold wall chemical vapor deposition reactor comprising a quartz envelope attachable to a base plate so as to form a closed quartz enclosure, a process gas inlet and a process gas outlet in said base plate communicating with said enclosure, an outer tube support system on said base plate within said closed quartz enclosure enclosing said gas inlet port and said gas outlet port, and a cover plate, said reactor further comprising a core tube support system on said base plate, said core tube support system being of smaller diameter and dcentered within said outer tube support system and ventilated for through flow gas, vertically emplacing within said enclosure on said core tube support system a silicon core tube, said core tube being of smaller diameter than said outer tube and open at both ends, vertically emplacing within said enclosure on said tube support system an outer tube, capping the upper end of said outer tube with said cover plate so as to form within said enclosure a closed reaction chamber bounded by said bas plate and said tube support system and the interior surface of said outer tube and said cover plate, applying radiant heat to said closed quartz enclosure sufficient for raising to and maintaining the interior surfaceds of said outer tube and said core tube at the deposition temperature of a select combination of carrier gas and silicon reactant material, flowing said carrier gas ladened with said silicon reactant material through said process gas inlet port into said primary reaction chamber, conducting within said closed reacton chamber a CVD process utilizing said combination of carrier gas and silicon reactant material such that a bulk polysilicon layer is deposited upon the interior surface of said outer tube and said cover plate, flowing the gaseous byproducts of said CVD process out through said process gas outlet port, and removing as a bulk polysilicon product from said quartz envelope said outer tube and said core tube with said bulk polysilicon layers.

13. A method for producing polysilicon according to claim 12, said reactor further comprising a blanket zone between said quartz envelope and said reaction chamber, and a blanket gas port in said base plate communicating with said blanket zone, said method further comprising the steps of:

admitting a blanket gas through said blanket gas port into said blanket gas zone, maintaining positive pressure in said blanket gas zone with respect to said primary reaction chamber during said CVD process.

14. A method for producing polysilicon according to claim 13, said carrier gas and said blanket gas being hydrogen.

15. A method for producing polysilicon according to claim 13, said carrier gas and said blanket gas being the same gas.

16. A method for producing polysilicon according to claim 12, said carrier gas being hydrogen, said silicon reactant material being silane.

17. A method for producing polysilicon according to claim 12, said carrier gas being hydrogen, said silicon reactant material being a chlorosilane.

18. A method for producing polysilicon according to claim 12, said carrier gas being an inert gas.

19. A method for producing polysilicon according to claim 12, said means for applying radiant heat comprising using an external radiant heater assembly surrounding said quartz envelope.

* * * * *

UNITED STATES PATENT AND TRADEMARK OFFICE
CERTIFICATE OF CORRECTION

PATENT NO. : 6,284,312 B1  Page 1 of 1
DATED : September 4, 2001
INVENTOR(S) : Chandra, Mohan, Jafri, Ijaz Hussain, Prasad, Gupta and Talbott, Jonathan A.

It is certified that error appears in the above-identified patent and that said Letters Patent is hereby corrected as shown below:

Column 2,
Line 11, delete "figment", insert -- fitment --.

Column 10,
Line 27, delete "applying heat", insert -- applying radient heat --;
Line 52, delete "communication", insert -- communicating --.

Column 11,
Line 24, delete "dcentered", insert -- centered --;
Line 35, delete "bas", insert -- base --;
Line 40, delete "surfaceds", insert -- surfaces --.

Signed and Sealed this

Third Day of December, 2002

JAMES E. ROGAN
*Director of the United States Patent and Trademark Office*